(12) United States Patent
Katakura

(10) Patent No.: US 6,531,249 B1
(45) Date of Patent: Mar. 11, 2003

(54) RETICLE BLANKS FOR CHARGED-PARTICLE-BEAM MICROLITHOGRAPHY AND METHODS FOR MAKING SAME

(75) Inventor: Norihiro Katakura, Kawasaki (JP)

(73) Assignee: Nikon Corporation, Tokyo (JP)

( * ) Notice: Subject to any disclaimer, the term of this patent is extended or adjusted under 35 U.S.C. 154(b) by 40 days.

(21) Appl. No.: 09/602,435

(22) Filed: Jun. 23, 2000

(30) Foreign Application Priority Data

Jun. 24, 1999 (JP) .......................................... 11-178340

(51) Int. Cl.[7] .............................. G03F 9/00; G03C 5/00
(52) U.S. Cl. .......................................... 430/5; 430/296
(58) Field of Search ............................. 430/5, 296, 22; 378/34, 35

(56) References Cited

U.S. PATENT DOCUMENTS 5,260,151 A * 11/1993 Berger et al. .................. 430/5
5,866,281 A * 2/1999 Guckel et al. ................. 430/22

* cited by examiner

Primary Examiner—Mark F. Huff
Assistant Examiner—Saleha R. Mohamedulla
(74) Attorney, Agent, or Firm—Klarquist Sparkman LLP

(57) ABSTRACT

Reticle blanks are disclosed for use in making reticles for charged-particle-beam microlithography. The reticle blanks include support struts formed by dry-etching intervening exposed regions of a silicon support substrate. The windows are defined by a dry-etching mask and are destined to become subfields of a reticle made from the reticle blank. The subfields of the reticle blank include patternable subfields and non-patternable subfields (dummy etching fields). The patternable subfields are destined to define respective portions of a reticle pattern, whereas the dummy subfields are not. The dummy etching fields are those that have experienced a dry-etching rate greater than a threshold value of 1.05-times the dry-etching rate of the patternable subfields. The reticle blanks also include support struts supporting a membrane (defining the subfields) and a peripheral frame connected to the support struts. The dummy etching fields are located peripherally to the patternable subfields.

9 Claims, 4 Drawing Sheets

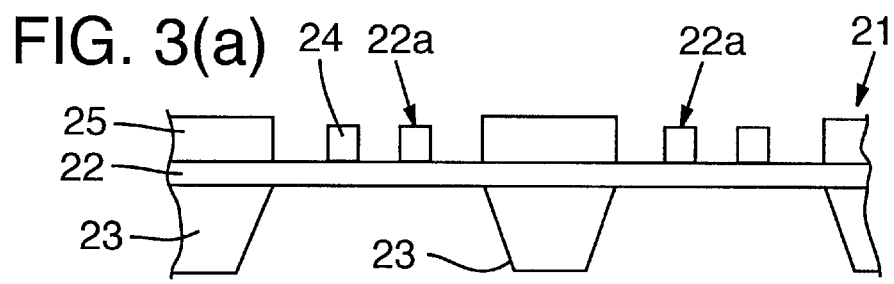
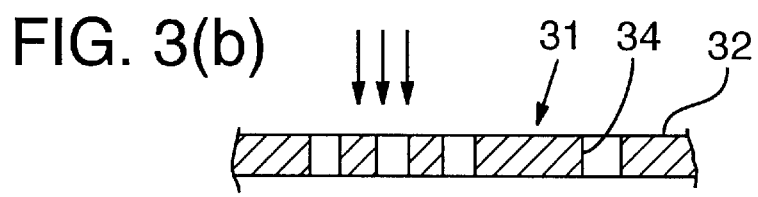
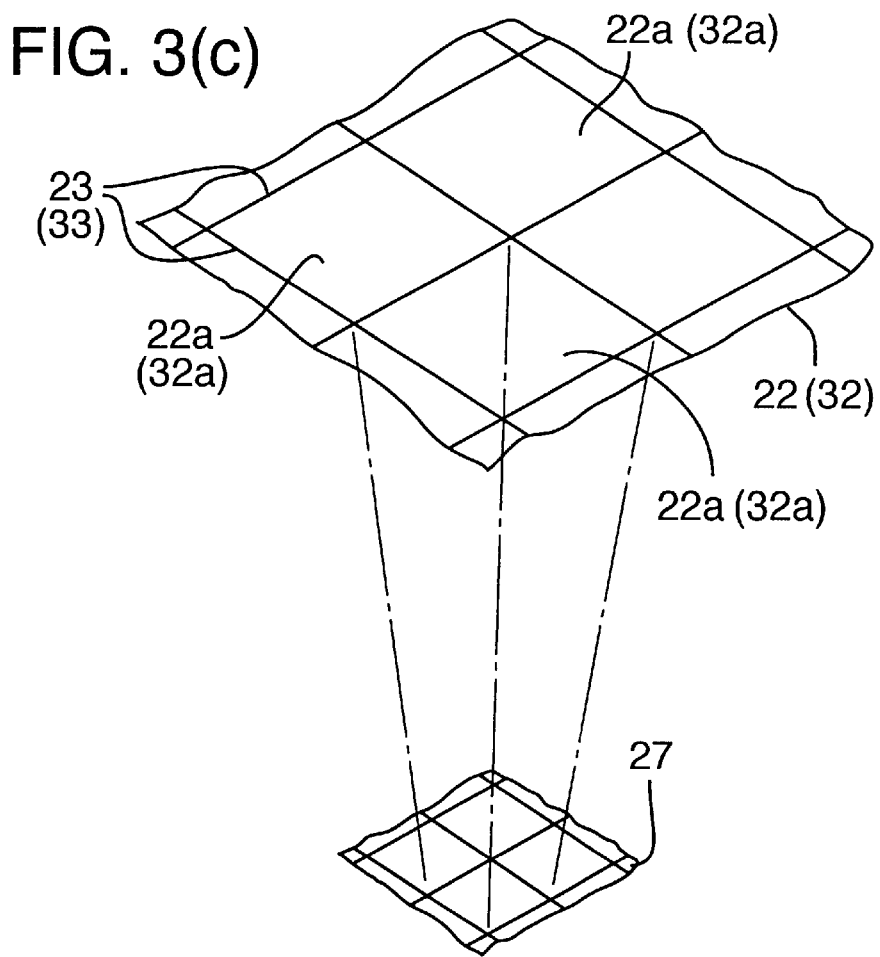

RETICLE BLANKS FOR CHARGED-PARTICLE-BEAM MICROLITHOGRAPHY AND METHODS FOR MAKING SAME

FIELD OF THE INVENTION

The present invention pertains to microlithography (projection-transfer of a pattern from a reticle or mask to a substrate) using a charged particle beam as an energy beam. Microlithography is a key technology used in the manufacture of semiconductor integrated circuits, displays, and the like. More specifically, the invention pertains to reticles for use in charged-particle-beam (CPB) microlithography and to methods for manufacturing such reticles.

BACKGROUND OF THE INVENTION

In recent years, as semiconductor integrated circuits have become increasingly miniaturized, the resolution limits of optical microlithography (i.e., projection-transfer of a pattern performed using ultraviolet light as an energy beam) have become increasingly apparent. As a result, considerable research effort currently is being expended to develop practical microlithography methods and apparatus that employ an alternative type of energy beam and that offer prospects of better resolution than optical microlithography. For example, considerable effort has been directed to use of X-rays. However, a practical X-ray system has not yet been developed because of many technical problems associated with that technology. Another candidate microlithography technology utilizes a charged particle beam, such as an electron beam or ion beam, as an energy beam.

A current type of electron-beam pattern-transfer system is an electron-beam writing system that literally "draws[|P]" a pattern on a substrate using an electron beam. In such a system, no reticle is used. Rather, the pattern is drawn line-by-line. These systems can form intricate patterns having features sized at 0.1 $\mu$m or less because, inter alia, the electron beam itself can be focused down to a spot diameter of several nanometers. However, with such systems, the more intricate the pattern, the more focused the electron beam must be in order to draw the pattern satisfactorily. Also, drawing a pattern line-by-line requires large amounts of time; consequently, this technology has very little utility in the mass production of semiconductor wafers that are processed where "throughput" (number of wafers processed per unit time) is an important consideration.

In view of the shortcomings in electron-beam drawing systems and methods, charged-particle-beam (CPB) projection-microlithography systems have been proposed in which a reticle defining the desired pattern is irradiated with a charged particle beam. The portion of the beam passing through the irradiated region of the reticle is "reduced" ("demagnified") as the image carried by the beam is projected onto a corresponding region of a wafer or other suitable substrate using a projection lens.

The reticle generally is of two types. One type is a scattering-membrane reticle 21 as shown in FIG. 3(a), in which pattern features are defined by scattering bodies 24 formed on a membrane 22 that is relatively transmissive to the beam. A second type is a scattering-stencil reticle 31 as shown in FIG. 3(b), in which pattern features are defined by beam-transmissive through-holes 34 in a membrane 32 that tends to scatter particles in the beam. The membrane 32 is normally silicon with a thickness of approximately 2 $\mu$m.

Because, from a practical standpoint, an entire reticle pattern cannot be projected simultaneously onto a substrate using a charged particle beam, conventional CPB microlithography reticles are divided or segmented into multiple "subfields" 22a, 32a each defining a respective portion of the overall pattern. The subfields 22a, 32a are separated from one another on the membrane 22, 32 by boundary regions (items 25 in FIG. 3(a)) that do not define any pattern features. In order to provide the membrane 22, 32 with sufficient mechanical strength and rigidity, support struts 23, 33 extend from the boundary regions 25.

Each subfield 22a, 32a typically measures approximately 1-mm square. The subfields 22a, 32a are arrayed in columns and rows across the reticle 21, 31. For projection-exposure, the subfields 22a, 32a are illuminated in a stepwise manner by the charged particle beam (serving as an "illumination beam"). As the illumination beam passes through each subfield, the beam becomes "patterned" according to the configuration of pattern elements in the subfield. As depicted in FIG. 3(c), the patterned beam propagates through a projection-optical system (not shown) to the sensitive substrate 27. (By "sensitive" is meant that the substrate is coated on its upstream-facing surface with a material, termed a "resist," that is imprintable with the image of the pattern as projected from the reticle.) The images of the subfields have respective locations on the substrate 27 in which the images are "stitched" together (i.e., situated contiguously) in the proper order to form the entire pattern on the substrate.

Certain steps of a conventional method for fabricating a reticle are depicted in FIGS. 4(a)–4(d), respectively. In a first step, an "SOI" (Silicon On Insulator) substrate 40 is made from a silicon support substrate 41, a silicon oxide layer 42, and an SOI layer 43, using conventional fabrication techniques (FIG. 4(a)). The silicon oxide layer 42 is formed on a first major surface 50 of the silicon support substrate 41, and the SOI layer 43 is formed on the silicon oxide layer 42. In a second step a thick film 44 of silicon oxide or resist is formed on or applied to, respectively, the second major surface 51 of the silicon support substrate 41 (FIG. 4(b)). The thick film 44 is patterned to form a dry-etching mask 46 that defines openings ("windows") 45 in which corresponding regions of the second major surface 51 are exposed. The silicon support substrate 41 exposed in the openings 45 is dry-etched (FIG. 4(c)).

The silicon support substrate 41 is dry-etched depthwise to the silicon oxide layer 42 that acts as an etch-stop barrier. In the resulting structure, the silicon oxide layer 42 and the SOI layer are supported by a silicon peripheral frame 41b and silicon struts 41a contiguous with the peripheral frame 41b. Each strut 41a is several hundred $\mu$m wide. The struts 41a are spaced apart from one another so as to leave open areas between the peripheral frame 41b and the struts 41a, and between individual struts 41a.

As evident in FIG. 4(d), the silicon oxide layer 42 is exposed in the openings between struts. The exposed silicon oxide 42 is removed using a mixture of HF+NH$_3$F, leaving the SOI layer 43 to become a reticle membrane 43a (FIG. 4(e)), thereby completing manufacture of a reticle "blank."

In the foregoing method, dry-etching must be performed to a depth equal to the thickness of the silicon support substrate 41 of the SOI substrate 40. For example, in the case of an SOI substrate 40 having a diameter of 3 inches, dry-etching is performed to a depth of at least 300 $\mu$m. In the case of an SOI substrate 40 having a diameter of 8 inches, dry-etching is performed to a depth of at least 700 $\mu$m.

The dry-etching technique summarized above is performed according to the well-known sidewall-protecting plasma dry-etching technique. Sidewall-protecting plasma dry-etching protects the sidewalls of the cavities being formed by inhibiting the etching away of surrounding structure. The sidewalls are protected by flowing a mixture of the silicon-etching gas and a sidewall-protecting gas. Upon contacting the sidewalls, the sidewall-protecting gas in the mixture polymerizes and forms polymer deposits on the sidewalls. The polymer deposits tend to protect the sidewalls from further dry-etching so that dry-etching proceeds preferentially in the thickness direction while lateral dry-etching into the sidewalls is suppressed.

Examples of gas mixtures for performing dry-etching while protecting sidewalls are $Cl_2+CHF_3$, $SF_6+C_3H_8$, and $SF_6+CCl_4$. These gas mixtures form a protective film by polymerization of $CHF_3$, $C_3H_8$, or $CCl_4$, respectively. With polymer deposits on the sidewalls, dry-etching of the silicon tends to progress in the thickness direction by action of the $Cl_2$ or $SF_6$.

Despite the use of sidewall protection, etching conventionally is inconsistent across the surface of the support substrate, especially with large reticle substrates. Suppose a reticle blank is prepared, comprising 9000 subfields arranged in 90 rows and 100 columns, from an 8-inch-diameter SOI substrate using the conventional fabrication method summarized above. Such a reticle blank 11 is shown schematically in FIG. 5 (without showing all 9000 subfields). The reticle blank 11 includes a peripheral frame 13, a membrane region 12, support struts 14, and subfields 15. To make such a reticle blank, the percentage of the total surface area of the SOI substrate to be dry-etched is at least 30 percent. I.e., the reticle blank has an "aperture ratio" of at least 30 percent. During dry-etching of the SOI substrate using conventional methods, the etching rate is extremely inconsistent compared to dry-etching a reticle blank in which the aperture ratio is 10 percent or less.

One reason for the poor consistency of etching rate is that supplying the etching-gas mixture to the surface being etched is frequently obstructed due to the etching itself. I.e., during etching, by-product gases are generated in large amounts. For etching to proceed smoothly, the by-product gases must be removed and replaced promptly with fresh etching gas. This gas replacement tends to occur relatively easily at peripheral regions of the surface being etched. But, at more interior regions of the surface, including regions only a few millimeters from the edge of the reticle blank, gas replacement is more difficult to achieve due to the relatively large amount of by-product gas produced in such regions compared to the edges of the reticle blank.

The etch rate in peripheral regions can be as much as 20-percent faster than the etch rate at the center of the reticle blank (where the aperture ratio is 30 percent or more), when using a conventional dry-etching apparatus to etch under conditions adjusted so that the etch rate in peripheral regions of the reticle blank typically is at a maximum of 5 percent faster than the etch rate of more interior regions of the surface (FIG. 2).

Whenever the etching rate is significantly faster in peripheral regions, as described above, side etching of struts in the peripheral regions tends to be excessive relative to the central regions. Side etching results in the struts being thinner closer to the membrane. Consequently, the shapes of the subfields in the peripheral regions of the reticle blank are deformed (FIG. 6).

According to a conventional solution to this problem, the pressure of the etching gas is reduced and the exhaust capacity of the etching apparatus is increased to achieve greater etching uniformity.

Unfortunately, this conventional solution can be used only with a much narrower selection of etching masks. Also, the thickness of the etching mask must be increased, which causes other problems due to the increased thickness.

SUMMARY OF THE INVENTION

In view of the shortcomings of the prior art as summarized above, an object of the invention is to provide, inter alia, reticle blanks (and methods for their manufacture) in which support struts and analogous features of patternable subfields are more consistently sized and shaped than conventionally.

To such end, and according to a first aspect of the invention, reticle blanks are provided for making a reticle for use in charged-particle-beam (CPB) microlithography. The reticle defines a chip pattern divided into multiple pattern portions. A representative embodiment of such a reticle blank comprises a membrane, a peripheral frame to which the periphery of the membrane is attached, and support struts. The support struts extend as a grid from the peripheral frame across the membrane, and are configured to support the membrane and to divide the membrane into multiple subfields. The number of subfields is greater than the number of pattern portions. Desirably, the subfields are divided into a group of patternable subfields and a group of dummy etching fields. The dummy etching fields are arranged in a dummy zone that is peripheral to the group of patternable subfields. Desirably, the support struts are contiguous with the peripheral frame, and both desirably are made of silicon.

According to another aspect of the invention, methods are provided for manufacturing a reticle blank for CPB microlithography. In a first step, an SOI substrate is provided that comprises a support silicon substrate, a silicon oxide layer on a first surface of the support silicon substrate, and an SOI layer on the silicon oxide layer. A dry-etching mask is formed on a second surface of the support silicon substrate. The dry-etching mask defines openings ("windows") corresponding to patternable subfields and openings corresponding to non-patternable subfields. The openings are separated from one another by regions of the dry-etching mask covering areas of the support silicon destined to become support struts. The openings corresponding to non-patternable subfields are located in a zone in which dry-etching is expected to be faster, by a predetermined factor (e.g., more than 1.05), than a rate of dry-etching in the patternable subfields. The support-silicon substrate exposed in the openings in the dry-etching mask is dry-etched, and the silicon oxide layer is removed. Generally, the zone of non-patternable subfields surrounds the patternable subfields, and the zone of non-patternable subfields is located on peripheral regions of the reticle blank.

The foregoing and additional features and advantages of the invention will be more readily apparent from the following detailed description, which proceeds with reference to the accompanying drawings.

BRIEF DESCRIPTION OF THE DRAWINGS

FIG. 3(a) is a schematic elevational section of a portion of a conventional scattering-membrane reticle.

FIG. 3(b) is a schematic elevational section of a portion of a conventional scattering-stencil reticle.

FIG. 3(c) is an oblique view showing certain aspects of conventional projection-transfer, with demagnification, of a reticle subfield to a substrate.

DETAILED DESCRIPTION

Figure 1:
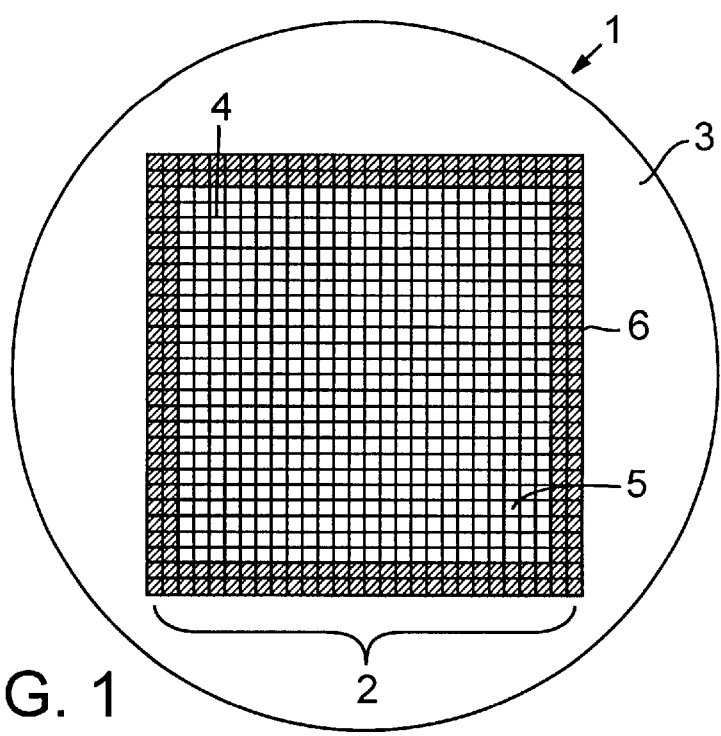
FIG. 1 is a schematic plan view of a reticle blank according to a representative embodiment of the invention.

A representative embodiment of a reticle blank made according to the invention is shown in FIG. 1. The FIG.-1 reticle blank is particularly suitable for use in fabricating a reticle for charged-particle-beam (CPB) microlithography.

Figure 2:
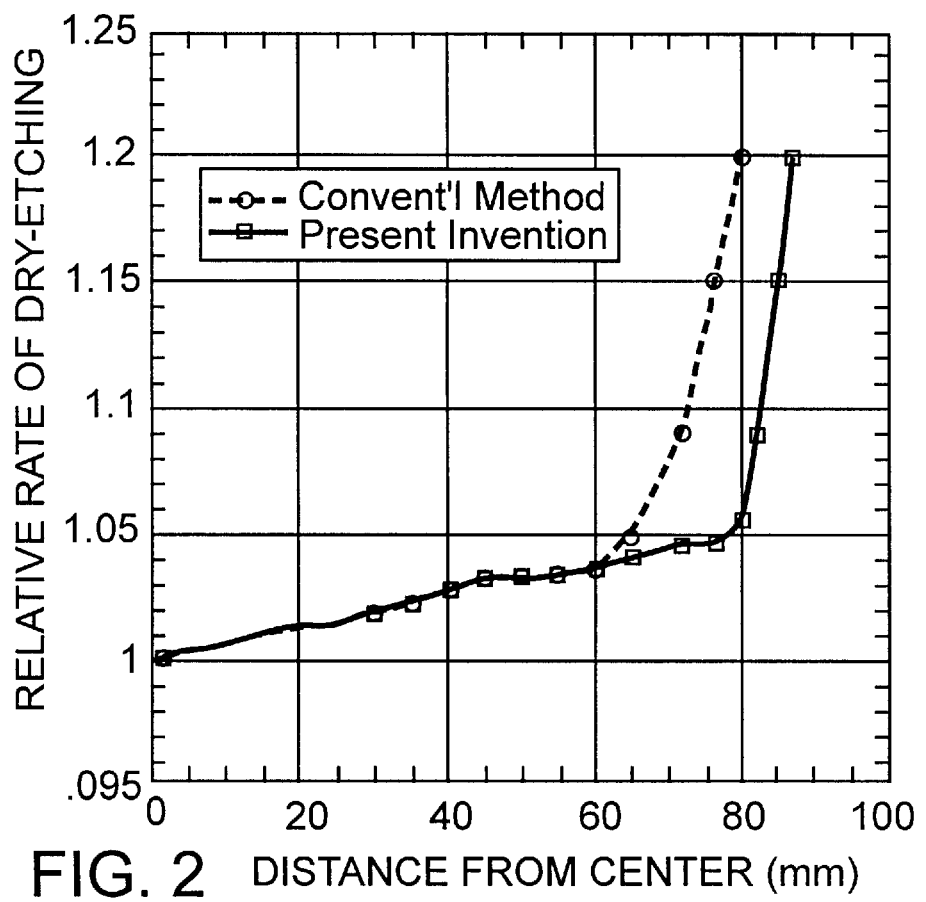
FIG. 2 shows plots of etching rate versus location on a reticle blank made by a method according to the invention, compared to a reticle blank made by a conventional method.

The FIG.-1 reticle blank 1 comprises a membrane region 2, a peripheral frame 3, and support struts 4. The peripheral frame 3 secures the periphery of the membrane region 2 so as to support the membrane region 2. The support struts 4 support the membrane region 2 and divide it into multiple subfields 5. The subfields 5 include patternable subfields (each destined to define a respective portion of an overall reticle pattern when the reticle blank is subsequently made into a reticle) and "dummy" etching fields (not intended to be patterned). In FIG. 1, the patternable subfields are indicated by lack of shading and are separated from one another by support struts 4. By way of example (although not specifically shown), the membrane region 2 includes 90 columns and 100 rows of patternable subfields 5, thereby providing 9000 patternable subfields in the membrane region 2. The dummy etching fields also are separated from one another by support struts 4. The dummy etching fields are located in a dummy-etching-field zone 6 (indicated by shading in FIG. 1) surrounding the patternable subfields 5. The designation of which regions of the reticle to designate as patternable subfields and which to designate as dummy etching fields depends upon the behavior of the reticle blank during etching. As seen in FIG. 2, the relative rate of dry-etching varies with distance from the center of the reticle blank. From the center to about 80 mm from the center, the etch rate typically increases comparatively slowly with increasing distance from the center. At about 80 mm from the center, however, the curve exhibits a pronounced "knee" and the etch rate rapidly increases with increasing distance from the center. For a particular reticle blank, one or more test etchings can be performed to determine the location of the knee of the curve and thus the location of the dummy etching fields.

The total amount of space on the reticle blank 1 occupied by the dummy region 6 depends upon the etching conditions and on the size of each non-patterned subfield. In the 9000-patternable-subfield example noted above, an exemplary total amount of space occupied by the dummy region 6 is the equivalent of 10 columns and 10 rows of subfields. In general, the dummy region 6 is configured so as to contain the subfields in which side-etching is excessive (FIG. 2).

More specifically, subfields designated as "patternable" are subfields in which the respective dry-etching rate is different by a factor of 1.00 to 1.05 from the target dry-etching rate. In other words, the patternable subfields are those in which the respective dry-etching rates vary by a factor of no more than 1.05 from the target dry-etching rate. If the dry-etching rate factor exceeds 1.05 for a given subfield, then side-etching in the subfield is excessive and the subfield will not be sized and shaped sufficiently uniformly to be a patternable subfield. Hence, such a subfield is designated a dummy etching field. Because subfields designated as dummy etching fields are those in which side-etching is more pronounced than in the patternable subfields 5, the support struts 4 in the dummy region 6 of the finished reticle blank 1 (compared to the patternable region) are narrower in regions adjacent the respective subfield membrane. If side-etching is excessive, then the support struts actually disappear.

Figure 4A:
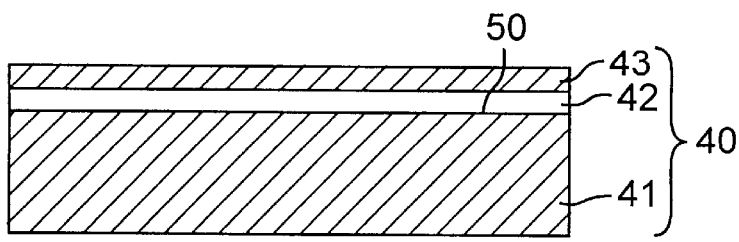
FIGS. 4(a)–4(e) depict, in schematic elevational sections, the results of certain respective steps in a conventional method for manufacturing a reticle blank.
Figure 4B:
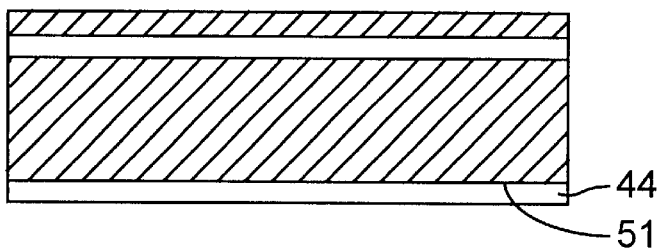
Figure 4C:
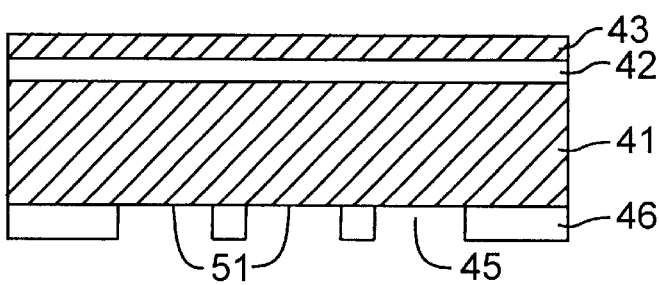
Figure 4D:
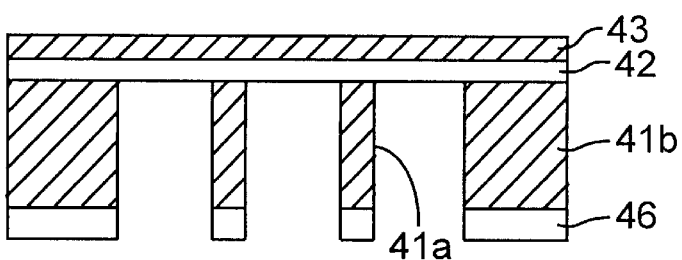
Figure 4E:
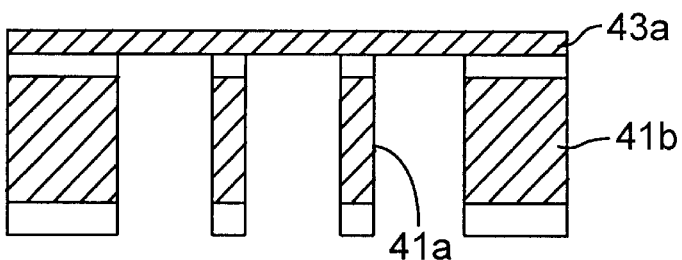
Figure 5:
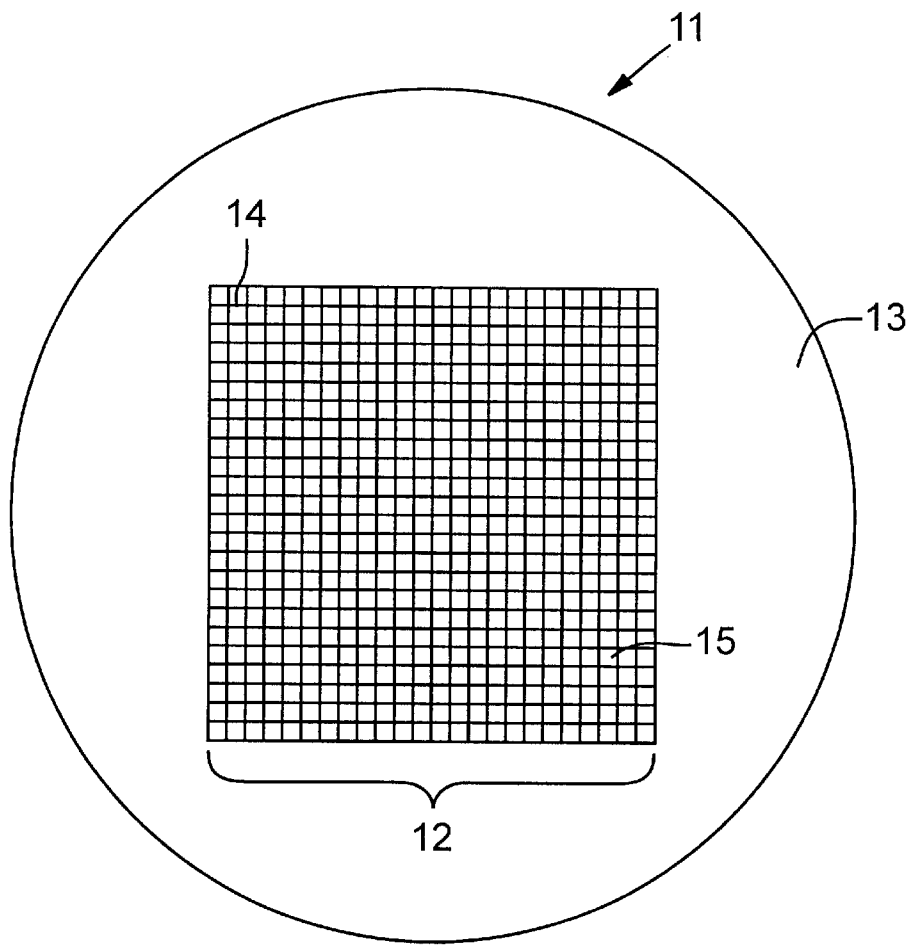
FIG. 5 is a schematic plan view of a conventional reticle blank that includes multiple subfields.
Figure 6:
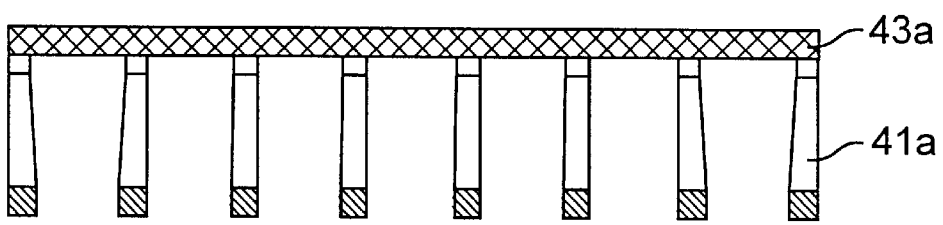
FIG. 6 is a schematic elevational section of a portion of a reticle blank made according to a conventional fabrication method.

The method for manufacturing a reticle blank, according to the invention, differs from the conventional method (FIGS. 4(a)–4(e)) in that, instead of the particular dry-etching mask used during the dry-etching step shown in FIG. 4(c), the dry-etching mask used in this embodiment defines a first group of openings (windows for defining patternable subfields destined to define a respective portion of the overall pattern) and a second group of openings (windows for defining dummy apertures).

Etch openings for defining dummy etching fields typically have a different size and/or shape than patternable subfields. Also, dummy etching fields are not limited to square-shaped. For example, they can be rectangular in shape.

After fabricating a reticle blank according to the invention, a reticle can be prepared from the reticle blank. For example, to make a scattering-stencil reticle, a resist is layered on the membrane. The resist is imaged with a specified fine reticle pattern using, e.g., an electron-beam direct-writing apparatus. The resist is developed, and exposed portions of the membrane are etched, using the remaining resist as an etching mask. After removing the resist, fabrication of the scattering-stencil reticle is complete.

The method described above is based on a so-called "membrane-flow" process in which the reticle pattern to be transferred to a sensitive substrate is formed on the membrane of the reticle blank after the membrane has been formed. As an alternative, the reticle can be formed using the so-called "wafer-flow" process in which the silicon support substrate 41 and silicon oxide layer 42 are etched after a reticle pattern has been formed on the SOI layer 43.

A reticle blank according to the invention allows a CPB microlithography reticle to be fabricated in which all the patterned subfields have a uniform shape and size. This is achieved by designating, as patternable subfields, only those subfields in which the dry-etching rate is substantially uniform. Non-patternable subfields, or "dummy" etching fields are those in which dry-etching rates are sufficiently high to cause significantly greater side-etching than in patternable subfields.

In addition, a reticle-blank manufacturing method according to the invention ensures a greater uniformity of the dry-etching rate in patternable subfields. This is because subfields in which the dry-etching rate is excessive are designated as non-patternable subfields ("dummy etching fields").

Whereas the invention has been described in connection with representative embodiments, it will be apparent that the invention is not limited to those embodiments. On the contrary, the invention is intended to encompass all modifications, alternatives, and equivalents as may be included within the spirit and scope of the invention, as defined by the appended claims.

What is claimed is:

1. A reticle blank for making a reticle for use in charged-particle-beam microlithography, the reticle defining a chip pattern divided into multiple pattern portions, the reticle blank comprising:

a membrane;

a peripheral frame to which a periphery of the membrane is attached; and support struts extending as a grid from the peripheral frame across the membrane, the support struts being configured to support the membrane and to divide the membrane into multiple subfields, the quantity of subfields being greater than the number of pattern portions.

2. The reticle blank of claim 1, wherein the subfields are divided into a group of patternable subfields and a group of dummy etching fields, the dummy etching fields being arranged in a dummy zone that is peripheral to the group of patternable subfields.

3. The reticle blank of claim 1, wherein the support struts are contiguous with the peripheral frame.

4. The reticle blank of claim 1, wherein the support struts and peripheral frame comprise silicon.

5. A charged-particle-beam microlithography reticle made from the reticle blank of claim 1.

6. A method for manufacturing a reticle blank, comprising:

providing an SOI substrate comprising a support silicon substrate, a silicon oxide layer on a first surface of the support silicon substrate, and an SOI layer on the silicon oxide layer;

forming on a second surface of the support silicon substrate a dry-etching mask, the dry-etching mask defining openings corresponding to patternable subfields and openings corresponding to non-patternable subfields, the openings being separated from one another by regions of the dry-etching mask covering areas of the support silicon destined to become support struts, and the openings corresponding to non-patternable subfields being located in a zone in which dry-etching is expected to be faster, by a predetermined factor, than a rate of dry-etching in the patternable subfields;

dry-etching the support silicon substrate exposed in the openings in the dry-etching mask; and removing the silicon oxide layer.

7. The method of claim 6, wherein the predetermined factor is 1.05.

8. The method of claim 6, wherein the zone of non-patternable subfields surrounds the patternable subfields.

9. The method of claim 8, wherein the zone of non-patternable subfields is located on peripheral regions of the reticle blank.

* * * * *

UNITED STATES PATENT AND TRADEMARK OFFICE
CERTIFICATE OF CORRECTION

PATENT NO.    : 6,531,249 B1
DATED         : March 11, 2003
INVENTOR(S)   : Katakura It is certified that error appears in the above-identified patent and that said Letters Patent is hereby corrected as shown below:

<u>Column 1,</u>
Line 34, ""draws[[P]'" should be -- draws --.

Signed and Sealed this

Fourth Day of November, 2003

JAMES E. ROGAN
*Director of the United States Patent and Trademark Office*